(12) United States Patent
Sugisawa

(10) Patent No.: US 10,460,896 B2
(45) Date of Patent: Oct. 29, 2019

(54) RELAY CONTROL DEVICE

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventor: Yuuki Sugisawa, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 136 days.

(21) Appl. No.: 15/557,148

(22) PCT Filed: Mar. 4, 2016

(86) PCT No.: PCT/JP2016/056836
§ 371 (c)(1),
(2) Date: Sep. 11, 2017

(87) PCT Pub. No.: WO2016/147914
PCT Pub. Date: Sep. 22, 2016

(65) Prior Publication Data
US 2018/0047535 A1    Feb. 15, 2018

(30) Foreign Application Priority Data
Mar. 16, 2015   (JP) ................................. 2015-052479

(51) Int. Cl.
*H01H 47/02*   (2006.01)
*H01H 47/04*   (2006.01)
(Continued)

(52) U.S. Cl.
CPC ......... *H01H 47/02* (2013.01); *B60R 16/0231* (2013.01); *B60R 16/03* (2013.01);
(Continued)

(58) Field of Classification Search
CPC ........ H01H 47/02; H01H 47/04; H01H 47/22; H01H 47/32; B60R 16/0231; B60R 16/03;
(Continued)

(56) References Cited

U.S. PATENT DOCUMENTS

2005/0105239 A1* 5/2005 Satoh .................... H01F 7/1844
361/139
2011/0109168 A1* 5/2011 Morimoto ............ H01H 47/325
307/104

(Continued)

FOREIGN PATENT DOCUMENTS

JP   H08-055720 A    2/1996
JP   2009-289671 A   12/2009
(Continued)

OTHER PUBLICATIONS

Search Report for PCT/JP2016/056836, dated Jun. 7, 2016.

*Primary Examiner* — Kevin J Comber
(74) *Attorney, Agent, or Firm* — Honigman LLP

(57) ABSTRACT

A relay control device is provided configured to reduce the amount of power supplied to a coil in an electromagnetic relay. The relay control device includes a control unit for generating and outputting a PFM signal to control the voltage-drop DC/DC converter unit, a filter unit allowing passage of the PFM signal, and a circuit unit controlling the operation of the voltage-drop DC/DC converter unit in accordance with the output signal of the filter unit. If the filter unit does not allow passage of the PFM signal, the circuit unit prevents the voltage-drop DC/DC converter unit
(Continued)

from dropping the voltage, and performs control so as to output the power supply voltage to a coil in the electromagnetic relay. If the filter unit prevents the PFM signal from passing, a current path from a power supply potential to a ground potential within a circuit unit is cut off by transistors.

11 Claims, 4 Drawing Sheets

(51) Int. Cl.
*H01H 47/32* (2006.01)
*B60R 16/023* (2006.01)
*H01H 47/22* (2006.01)
*H02M 3/156* (2006.01)
*H03H 7/06* (2006.01)
*H02M 3/157* (2006.01)
*B60R 16/03* (2006.01)
*H02M 1/00* (2006.01)

(52) U.S. Cl.
CPC ............ *H01H 47/04* (2013.01); *H01H 47/22* (2013.01); *H01H 47/32* (2013.01); *H02M 3/156* (2013.01); *H02M 3/157* (2013.01); *H03H 7/06* (2013.01); *H02M 2001/0019* (2013.01); *H02M 2001/0035* (2013.01); *Y02T 10/92* (2013.01)

(58) Field of Classification Search
CPC ........ H03H 7/06; H02M 3/157; H02M 3/156; H02M 2001/0019; H02M 2001/0035; Y02T 10/92
USPC ......................................................... 361/153
See application file for complete search history.

(56) References Cited

U.S. PATENT DOCUMENTS

| | | | |
|---|---|---|---|
| 2012/0319499 A1* | 12/2012 | Ooishi | H02M 3/156 307/104 |
| 2015/0171753 A1 | 6/2015 | Morimoto et al. | |
| 2015/0294822 A1* | 10/2015 | Morimoto | H03K 17/165 361/160 |

FOREIGN PATENT DOCUMENTS

| | | |
|---|---|---|
| JP | 2010-251200 A | 11/2010 |
| JP | 2013-127864 A | 6/2013 |
| JP | 2014-049281 A | 3/2014 |

\* cited by examiner

RELAY CONTROL DEVICE

CROSS-REFERENCE TO RELATED APPLICATIONS

This application is the U.S. national stage of PCT/JP2016/056836 filed Mar. 4, 2016, which claims priority of Japanese Patent Application No. JP 2015-052479 filed Mar. 16, 2015.

TECHNICAL FIELD

The present invention relates to a relay control device for controlling an electromagnetic relay that switches between supply and non-supply of power from a power supply to an electrical load mounted in a vehicle, for example.

BACKGROUND

A variety of electrical loads, such as ECUs (Electronic Control Units), various sensors, lamps, and motors, are mounted in a vehicle. Power is supplied to these electrical loads from a power supply such as a battery. In a vehicle, whether or not to supply power to the respective electrical loads needs to be switched in accordance with the state of an ignition switch or an accessory switch. For this reason, electromagnetic relays are provided in power supply paths from the power supply to the electrical loads, and the power supply to the electrical loads is individually controlled by individually controlling whether to set the electromagnetic relay to a conductive state or a cut-off state.

The invention described in JP 2009-289671A is a relay control device that causes a large current to flow through a relay coil when a relay circuit starts to be driven, and causes a small current to flow through the relay coil after a relay contact has turned on. This relay control device reduces the current flowing through the relay coil after the relay contact has turned on to reduce the heat generated by the relay coil.

In a configuration in which the power supply to an electrical load is controlled by an electromagnetic relay, the coil needs to be energized so as to set the electromagnetic relay to a conductive state. Due to causing a large current to flow through the coil, there is a concern about the heat generated by the coil, the life of the coil being adversely affected, or the like.

The invention has been made in view of the foregoing situation, and aims to provide a relay control device capable of reducing the amount of power supplied to a coil in an electromagnetic relay.

SUMMARY

A relay control device according to the present invention is a relay control device that controls switching between a conductive state and a cut-off state of an electromagnetic relay by energizing a coil, including: a voltage-drop DC/DC converter unit for dropping a voltage supplied from a power supply and outputting the dropped voltage to the coil; a control unit for outputting a control signal for modulating a pulse frequency to control an operation of the voltage-drop DC/DC converter unit; a filter unit for allowing passage of the control signal output by the control unit that has a predetermined frequency; and a circuit unit for controlling the operation of the voltage-drop DC/DC converter unit in accordance with a signal output by the filter unit, the circuit unit being provided between the filter unit and the voltage-drop DC/DC converter unit, wherein, if the filter unit does not allow passage of the control signal, the circuit unit performs control so that the voltage-drop DC/DC converter unit outputs the voltage supplied from the power supply without dropping the voltage, and cuts off a current path from the power supply to a ground potential within the circuit.

In the relay control device according to the present invention, the voltage-drop DC/DC converter unit is a chopper converter circuit that drops the voltage by switching between a conductive state and a cut-off state of a switching element, and if the filter unit does not allow passage of the control signal, the circuit unit keeps the switching element in a conductive state.

In the relay control device according to the present invention, the filter unit is configured to output a signal having a predetermined voltage in a case of not allowing passage of the control signal, and the circuit unit has circuitry in which no voltage change occurs within the circuit if an output signal of the filter unit does not change.

The relay control device according to the present invention further includes a switching element connected to the coil in series, the control unit controlling whether to set the switching unit to a conductive state or a cut-off state, wherein the control unit is configured to set the switching element to a conductive state after stopping the voltage-drop DC/DC converter unit dropping the voltage, and cause the voltage-drop DC/DC converter unit to start dropping the voltage after setting the switching element to a conductive state.

The relay control device according to the present invention is mounted in a vehicle, and further includes a cut-off unit for cutting off the control signal from the control unit to the filter unit if an ignition switch in the vehicle is in an OFF state.

In the present invention, the voltage supplied from the power supply is dropped by the voltage-drop DC/DC converter unit, and the dropped voltage is output to the coil in the electromagnetic relay. Thus, the amount of current flowing through the coil in the electromagnetic relay can be reduced. The relay control device includes the control unit that generates and outputs the control signal for modulating a pulse frequency to control the operation of the voltage-drop DC/DC converter unit. The relay control device also includes the filter unit for only allowing passage of the control signal output by the control unit that has the predetermined frequency, and the circuit unit for controlling the operation of the voltage-drop DC/DC converter unit in accordance with the output signal of the filter unit. If the filter unit does not allow passage of the control signal from the control unit, the circuit unit does not cause the voltage-drop DC/DC converter unit to drop the voltage, and performs control so as to output the power supply voltage to the coil in the electromagnetic relay. Thus, for example, if no operation command (i.e. control signal) is given from the control unit, or if a normal control signal is not output due to a failure of the control unit, the power supply voltage can be directly output to the coil to control whether to set the electromagnetic relay to a conductive state or a cut-off state.

The circuit unit also has a configuration in which, if the filter unit does not allow passage of the control signal from the control unit, the current path from the power supply is cut off within the circuit of the circuit unit. Thus, it is possible to reduce power consumption in the circuit unit in a state of directly outputting the power supply voltage to the coil.

As the voltage-drop DC/DC converter unit in the present invention, for example, a chopper converter circuit is used, which is constituted by circuit elements such as a switching element, a coil, a capacitor, and a diode. The circuit unit can adjust an output voltage value of the voltage-drop DC/DC converter unit by controlling the switching element in accordance with the control signal that has passed through the filter unit. If the filter unit does not allow passage of the control signal from the control unit, the circuit unit can directly output the power supply voltage by keeping the switching element in a conductive state.

In the present invention, the filter unit is configured to output a signal having a predetermined voltage (e.g. a signal having a ground potential) in the case of not allowing passage of the control signal from the control unit. The circuit unit can be configured to cause the voltage-drop DC/DC converter unit to directly output the power supply voltage in response to a signal having the predetermined voltage being input. Also, the circuit unit has circuitry in which no voltage change occurs within the circuit if the output signal of the filter unit does not change. Thus, if the filter unit does not allow passage of the control signal, power consumption in the circuit unit can be reliably reduced.

In the present invention, the switching element is connected in series to the coil in the electromagnetic relay, and the control unit controls whether to set this switching element to a conductive state or a cut-off state. Thus, the control unit can control whether to set the electromagnetic relay to a conductive state or a cut-off state. In the case of switching this switching element to a conductive state, the control unit first stops the voltage-drop DC/DC converter unit dropping the voltage to directly output the power supply voltage to the coil in the electromagnetic relay, and thereafter switches the switching element to a conductive state. Thus, the electromagnetic relay can be switched rapidly. After setting the switching element to a conductive state, the control unit starts to cause the voltage-drop DC/DC converter unit to drop the voltage. Thus, the amount of current flowing through the coil after switching the electromagnetic relay can be reduced.

In the present invention, the relay control device is mounted in a vehicle. The relay control device further includes the cutoff unit for cutting off the control signal given from the control unit to the filter unit if the ignition switch in the vehicle is in an OFF state. With this configuration, if the ignition switch in the vehicle is in an OFF state, the control signal does not pass through the filter unit, and the voltage-drop DC/DC converter unit directly outputs the power supply voltage to the coil. Accordingly, power consumption in the circuit unit can be reduced when the ignition switch is in an OFF state.

Advantageous Effects of Invention

The present invention employs a configuration in which the power supply voltage is dropped by the voltage-drop DC/DC converter unit to output the dropped power supply voltage to the coil in the electromagnetic relay, thereby being able to reduce the amount of power supplied to the coil in the electromagnetic relay.

DETAILED DESCRIPTION OF PREFERRED EMBODIMENTS

Figure 1:
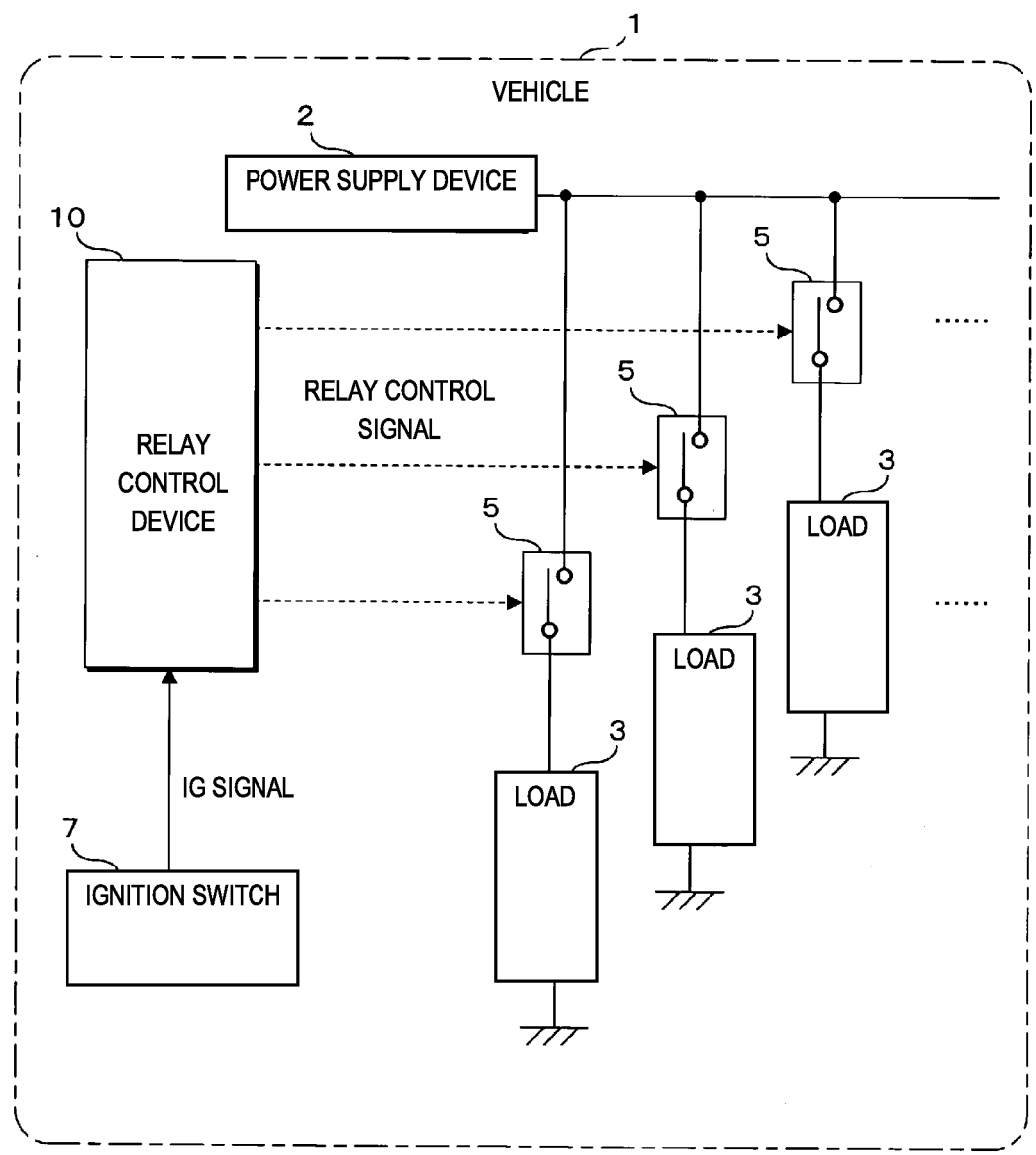
FIG. 1 is a schematic diagram showing a configuration of a vehicle in which a relay control device according to an embodiment is mounted.

Hereinafter, the present invention will be specifically described based on the drawings that show an embodiment thereof. FIG. 1 is a schematic diagram showing a configuration of a vehicle in which a relay control device according to this embodiment is mounted. A relay control device 10 according to this embodiment is a device that individually controls whether to set one or more electromagnetic relays 5 to a conductive state or a cut-off state, the electromagnetic relays 5 being provided in power supply paths from a power supply device 2, which is mounted in a vehicle 1, to one or more electrical loads 3. The power supply device 2 is a device such as a battery or an alternator mounted in the vehicle 1, and outputs a voltage of 12 V, for example. Examples of the electrical loads 3 mounted in the vehicle 1 include devices such as an ECU, a communication device, a car navigation device, an audio device, various sensors, lamps, motors, and actuators, which operate using the power supplied from the power supply device 2.

Figure 2:
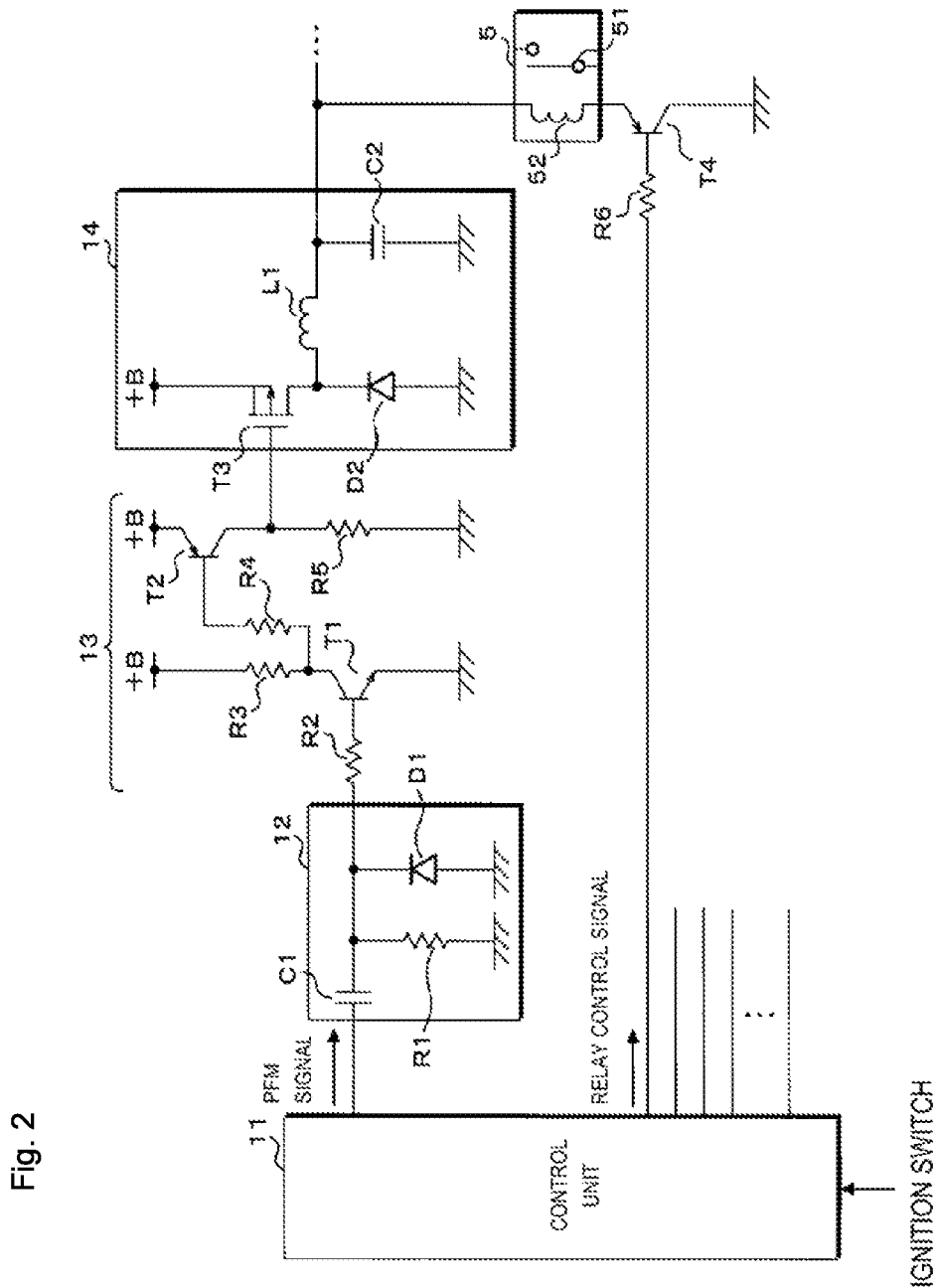
FIG. 2 is a block diagram showing a configuration of the relay control device.

In this embodiment, an electromagnetic relay 5 is provided in the power supply path from the power supply device 2 to each load 3. The electromagnetic relay 5 is a relay that is constituted by a contact 51 and a coil 52 (which are shown in FIG. 2) and switches between a conductive state and a cut-off state of the contact 51, by energizing the coil 52. In this embodiment, the electromagnetic relay 5 is configured so that the contact 51 enters a conductive state as a result of the coil 52 being energized, the power supply device path from the power supply device 2 to the load 3 is connected, and the power is supplied from the power supply device 2 to the load 3. However, the electromagnetic relay 5 may be configured so that the contact 51 enters a cut-off state as a result of the coil 52 being energized.

The relay control device 10 outputs a relay control signal individually to the respective electromagnetic relays 5, and individually controls switching between a conductive state and a cut-off state of the electromagnetic relays 5, thereby controlling the power supply to the respective loads 3. An IG signal, which indicates an ON/OFF state of an IG (ignition) switch 7 provided in the vehicle 1, is input to the relay control device 10. The relay control device 10 controls power supply in accordance with the ON/OFF state of the IG switch 7 based on the input IG signal.

FIG. 2 is a block diagram showing a configuration of the relay control device 10. Note that, in FIG. 2, a portion connected to the power supply device 2 is denoted as "+B", and the loads 3 and the power supply paths thereto are omitted. The relay control device 10 according to this embodiment is configured to include a control unit 11, a filter unit 12, a circuit unit 13, a voltage-drop DC/DC converter unit 14, and so forth. The control unit 11 may be configured as an IC (Integrated Circuit), such as a microcomputer, or may be configured as a control circuit in which a plurality of circuit elements are connected to a circuit board. In this embodiment, the control unit 11 receives at least the input of the IG signal from the IG switch 7, and may also receive the input of a signal that indicates an ON/OFF state of an accessory switch, for example.

The control unit 11 also outputs, at least, one PFM (Pulse Frequency Modulation) signal and a plurality of relay control signals. The PFM signal is a signal to control operations of the voltage-drop DC/DC converter unit 14, i.e. for controlling the voltage value of the voltage output by the voltage-drop DC/DC converter unit 14. The output voltage of the voltage-drop DC/DC converter unit 14 is high when the frequency of the PFM signal is high, and the output voltage of the voltage-drop DC/DC converter unit 14 is low when the frequency of the PFM signal is low. The control unit 11 can control operations of the voltage-drop DC/DC converter unit 14 by controlling the frequency of the PFM signal to be output.

In the relay control device 10 according to this embodiment, the PFM signal output by the control unit 11 is input to the filter unit 12. The filter unit 12 allows passage of the signal having a predetermined frequency (frequency band), and cuts off the signal having other frequencies. In this embodiment, the filter unit 12 is a high pass filter, which allows passage of signals having a frequency that exceeds the predetermined frequency, and cuts off signals having a frequency that does not exceed the predetermined frequency.

For example, the filter unit 12 is constituted by a capacitor C1, a resistor R1, and a diode D1. The filter unit 12 is connected to the control unit 11 with a first end of the capacitor C1 serving as an input terminal, and a second end of the capacitor C1 serves as an output terminal. The second end of the capacitor C1 is connected to a ground potential via the resistor R1 and is also connected to a cathode of the diode D1, and an anode of the diode D1 is connected to the ground potential. With this configuration, the filter unit 12 allows passage of the signal having a frequency that exceeds the predetermined frequency, and cuts off the signal having a frequency that does not exceed the predetermined frequency. The output of the filter unit 12 is the ground potential in the case of cutting off the signal (i.e. in the case of not allowing passage of the signal).

The signal output by the filter unit 12 (PFM signal or ground potential) is output to the circuit unit 13. The circuit unit 13 is a circuit for communicating the output signal of the filter unit 12 to the voltage-drop DC/DC converter unit 14. For example, the circuit unit 13 is constituted by four resistors R2 to R5 and two transistors T1 and T2. Note that the transistor T1 is an NPN-type bipolar transistor, and the transistor T2 is a PNP-type bipolar transistor. The circuit unit 13 is connected to the output of the filter unit 12, with a first end of the resistor R2 serving as an input terminal. A second end of the resistor R2 is connected to a base of the transistor T1, an emitter of the transistor T1 is connected to the ground potential, and a collector of the transistor T1 is connected to the power supply potential via the resistor R3. Note that, although the power supply potential is denoted as +B in FIG. 2, this power supply potential is the output potential of the power supply device 2. The collector of the transistor T1 is connected to a base of the transistor T2 via the resistor R4. An emitter of the transistor T2 is connected to the power supply potential, and a collector of the transistor T2 is connected to the ground potential via the resistor R5. The collector of the transistor T2 serves as an output terminal of the circuit unit 13, and is connected to the voltage-drop DC/DC converter unit 14.

With this configuration, the circuit unit 13 can amplify the output signal of the filter unit 12 and output the amplified signal to the voltage-drop DC/DC converter unit 14. If the filter unit 12 does not allow passage of the PFM signal, and the input to the circuit unit 13 is the ground potential, no potential change occurs within the circuit unit 13. In this state, both the transistors T1 and T2 in the circuit unit 13 are in a non-conductive state, and the current path from the power supply potential to the ground potential is cut off within the circuit unit 13. The output of the circuit unit 13 at this time is the ground potential.

The signal output by the circuit unit 13 (PFM signal or ground potential) is input to the voltage-drop DC/DC converter unit 14. The voltage-drop DC/DC converter unit 14 is a circuit that drops the power supply voltage in accordance with the input signal, and then outputs the dropped power supplied voltage. For example, the voltage-drop DC/DC converter unit 14 is constituted by a transistor T3, a diode D2, a coil L1, and a capacitor C2. Note that the transistor T3 is a P-channel field-effect transistor. The voltage-drop DC/DC converter unit 14 is connected to the output of the circuit unit 13, with a gate of the transistor T3 serving as an input terminal. A source of the transistor T3 is connected to the power supply potential, a cathode of the diode D2 is connected to a drain of the transistor T3, and an anode of the diode D2 is connected to the ground potential. A first end of the coil L1 is connected to the drain of the transistor T3, a first end of the capacitor C2 is connected to a second end of the coil L1, and a second end of the capacitor C2 is connected to the ground potential. The second end of the coil L1 (first end of the capacitor C2) serves as an output terminal of the voltage-drop DC/DC converter unit 14.

The voltage-drop DC/DC converter unit 14 with this configuration is a so-called chopper converter circuit. In the case of receiving the input of the PFM signal from the circuit unit 13, the transistor T3 in the voltage-drop DC/DC converter unit 14 repeats turning on and off in accordance with a change in the PFM signal. A voltage change at the drain of the transistor T3 due to the repeating of turning on and off is smoothed by the coil L1 and capacitor C2, and is then output. In the voltage-drop DC/DC converter unit 14, the higher the frequency of the input PFM signal, the longer the on-time of the transistor T3 within a fixed time, and accordingly, the output voltage is higher. Conversely, in the voltage-drop DC/DC converter unit 14, the lower the frequency of the input PFM signal, the shorter the on-time of the transistor T3 within a fixed time, and accordingly, the output voltage is lower. If the input signal is fixed to the ground potential, the transistor T3 in the voltage-drop DC/DC converter unit 14 is kept in an ON state, and accordingly, the voltage-drop DC/DC converter unit 14 outputs the power supply voltage.

In this embodiment, the output of the voltage-drop DC/DC converter unit 14 is given to the coils 52 in all electromagnetic relays 5 provided in the vehicle 1 (however, FIG. 2 shows only one electromagnetic relay 5). The electromagnetic relays 5 each include the contact 51 and the coil 52. In each electromagnetic relay 5, the contact 51 enters a connected state as a result of the coil 52 being energized. As shown in FIG. 1, a first end of the contact 51 in each electromagnetic relay 5 is connected to the output of the power supply device 2, and a second end thereof is connected to a corresponding load 3. A first end of the coil 52 in each electromagnetic relay 5 is connected to the output of the voltage-drop DC/DC converter unit 14, as mentioned above. A second end of the coil 52 is connected to the ground potential via a corresponding transistor T4. The transistor T4 is an NPN-type bipolar transistor, a base thereof is connected to the control unit 11 via a resistor R6, an emitter thereof is connected to the ground potential, and a collector thereof is connected to the coil 52 in the corresponding electromagnetic relay 5. Note that, although not shown in FIG. 2, a pair of the transistor T4 and resistor R6 is provided for each electromagnetic relay 5.

The control unit 11 outputs a relay control signal to the respective electromagnetic relays 5. For example, if the control unit 11 outputs a high-level signal as the relay control signal, the contact 51 enters a connected state as a result of the transistor T4 turning on and a current flowing through the coil 52 in the electromagnetic relay 5, and thus power is supplied from the power supply device 2 to the corresponding load 3. In contrast, if the control unit 11 outputs a low-level signal as the relay control signal, the contact 51 enters a cut-off state since the transistor T4 is turned off and a current does not flow through the coil 52 in the electromagnetic relay 5, and power is not supplied from the power supply device 2 to the corresponding load 3.

Note that, for example, the electromagnetic relay 5, transistor T4, and resistor R6 shown in FIG. 2 may be provided in the relay control device 10, or may be arranged near the corresponding load 3, for example, or may be arranged at appropriate positions in a power supply path from the power supply device 2 to the corresponding load 3, for example.

If the IG switch 7 is in an OFF state based on the input IG signal, the control unit 11 does not output the PFM signal (i.e. outputs a low-level signal or a ground potential signal). In this case, the transistor T3 in the voltage-drop DC/DC converter unit 14 is kept in an ON state, and accordingly, the voltage-drop DC/DC converter unit 14 outputs the power supply voltage. If the IG switch 7 enters an ON state, the control unit 11 starts outputting the PFM signal. At this time, the control unit 11 appropriately sets the frequency of the PFM signal in accordance with the number of loads 3 to which power is to be supplied, for example.

In addition, in the relay control device 10 according to this embodiment, the control unit 11 performs the following control in the case of switching any one of the electromagnetic relays 5 from a cut-off state to a conductive state (i.e. in the case of changing any one of relay control signals from a low level to a high level). The control unit 11 first stops outputting the PFM signal. As a result, the voltage-drop DC/DC converter unit 14 outputs the power supply voltage to the coils 52 in the electromagnetic relays 5. Next, the control unit 11 switches the relay control signal corresponding to the electromagnetic relay 5 to be switched from the low level to the high level. Thus, the transistor T4 corresponding to the electromagnetic relay 5 to be switched turns on, a current flows through the coil 52, and the contact 51 enters a connected state. By increasing the amount of power supplied to the coil 52 when switching the electromagnetic relay 5, the contact 51 can be switched more rapidly. Thereafter, the control unit 11 resumes outputting the PFM signal. As a result, the voltage-drop DC/DC converter unit 14 drops the power supply voltage in accordance with the frequency of the PFM signal, and then outputs the dropped power supply voltage. After switching the electromagnetic relay 5, the amount of power supplied to the coil 52 can be reduced as a result of the voltage-drop DC/DC converter unit 14 outputting the dropped voltage. Note that, in the case of switching the electromagnetic relay 5 from a conductive state to a cut-off state, the above control does not need to be performed, and the control unit 11 need only simply change the relay control signal from the high level to the low level.

Figure 3:
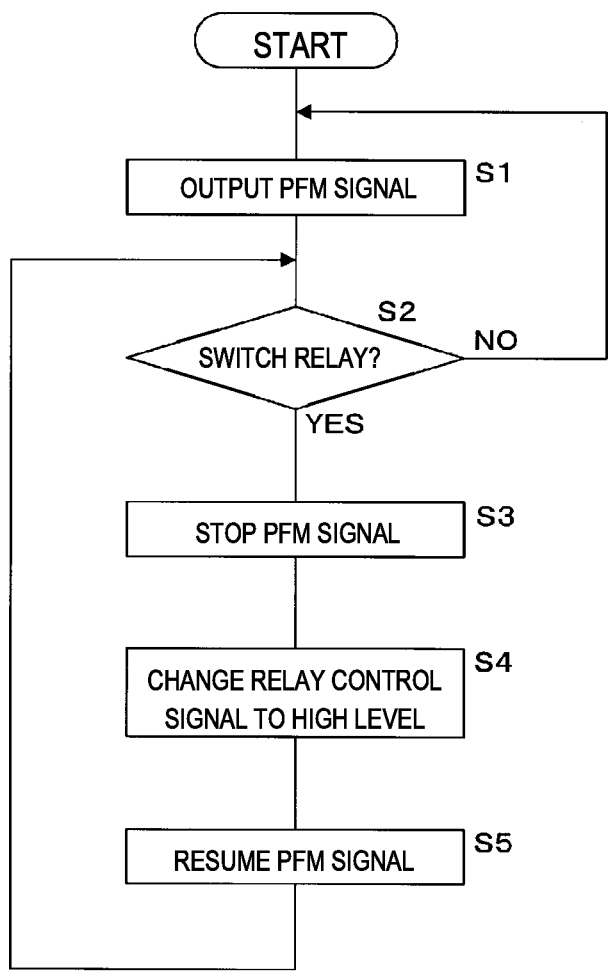
FIG. 3 is a flowchart showing a procedure of processing to control an electromagnetic relay performed by the relay control device.

FIG. 3 is a flowchart showing a procedure of processing to control the electromagnetic relay 5 performed by the relay control device 10. For example, if the IG switch 7 enters an ON state, the control unit 11 in the relay control device 10 outputs the PFM signal (step S1). Thereafter, the control unit 11 determines whether or not at least one of the plurality of electromagnetic relays 5 provided in the vehicle 1 needs to be switched from a cut-off state to a conductive state (step S2). If no electromagnetic relay 5 needs to be switched (S2: NO), the control unit 11 returns the processing to step S1.

If any of the electromagnetic relays 5 needs to be switched (S2: YES), the control unit 11 stops outputting the PFM signal (step S3). Thus, the power supply voltage is supplied to the coils 52 in the electromagnetic relays 5. Next, the control unit 11 changes the relay control signal corresponding to the electromagnetic relay 5 to be switched from the low level to the high level (step S4). Thus, the electromagnetic relay 5 to be switched enters a conductive state. Thereafter, the control unit 11 resumes outputting the PFM signal (step S5), and returns the processing to step S2.

In the relay control device 10 having the above-described configuration according to this embodiment, the voltage-drop DC/DC converter unit 14 drops the voltage supplied from the power supply device 2, and outputs the dropped voltage to the coil 52 in the electromagnetic relay 5. Thus, the amount of current flowing through the coil 52 in the electromagnetic relay 5 can be reduced. The relay control device 10 includes the control unit 11 for generating and outputting the PFM signal to control operations of the voltage-drop DC/DC converter unit 14. The relay control device 10 also includes the filter unit 12 for allowing passage of the PFM signal output by the control unit 11 that has a predetermined frequency, and the circuit unit 13 for controlling operations of the voltage-drop DC/DC converter unit 14 in accordance with an output signal of the filter unit 12. If the filter unit 12 does not allow passage of the PFM signal, the circuit unit 13 does not cause the voltage-drop DC/DC converter unit 14 to drop the voltage, and performs control so as to output the power supply voltage to the coil 52 in the electromagnetic relay 5. With this configuration, for example, if no operation command is given from the control unit 11 through the PFM signal, or if a normal PFM signal is not output due to a failure or the like of the control unit 11, the power supply voltage can be directly output to the coil 52 to control whether to set the electromagnetic relay 5 to a conductive state or a cut-off state.

If the filter unit 12 does not allow passage of the PFM signal from the control unit 11, the circuit unit 13 is configured so that the current path from the power supply potential to the ground potential is cut off by the transistors T1 and T2 within the circuit. Thus, the power consumption in the circuit unit 13 can be reduced in a state of directly outputting the power supply voltage to the coil 52 in the electromagnetic relay 5.

As the voltage-drop DC/DC converter unit 14, a chopper conversion circuit is used that is constituted by the transistor T3, coil L1, capacitor C2, and diode D2. The circuit unit 13 can adjust the output voltage value of the voltage-drop DC/DC converter unit 14 by controlling the transistor T3 in accordance with the PFM signal that has passed through the filter unit 12. If the filter unit 12 does not allow passage of the PFM signal from the control unit 11, the circuit unit 13 can directly output the power supply voltage by keeping the transistor T3 in a conductive state.

In the case of not allowing passage of the PFM signal from the control unit 11, the filter unit 12 is configured to output a ground potential signal, for example. The circuit unit 13 is configured to cause the voltage-drop DC/DC converter unit 14 to directly output the power supply voltage in response to the input of the ground potential signal from the filter unit 12. Also, the circuit unit 13 has circuitry in which no voltage change occurs within the circuit if the output signal of the filter unit 12 does not change. With this configuration, power consumption in the circuit unit 13 can be reliably reduced when the filter unit 12 does not allow passage of the PFM signal.

The transistor T4 is connected in series to the coil 52 in the electromagnetic relay 5, and the control unit 11 controls whether to set this transistor T4 to a conductive state or a cut-off state. Thus, the control unit 11 can control whether to set the electromagnetic relay 5 to a conductive state or a cut-off state. In the case of switching this transistor T4 to a conductive state, the control unit 11 first stops the voltage-drop DC/DC converter unit 14 dropping the voltage to directly output the power supply voltage to the coil 52 in the electromagnetic relay 5, and thereafter switches the transistor T4 to a conductive state. Thus, the amount of power supplied to the coil 52 at the time of switching can be increased, and accordingly, the electromagnetic relay 5 can be rapidly switched. After setting the transistor T4 to a conductive state, the control unit 11 starts to cause the voltage-drop DC/DC converter unit 14 to drop the voltage, and can thus reduce the amount of current flowing through the coil 52 after switching the electromagnetic relay 5.

Note that, although this embodiment has given the description while taking, as an example, the electromagnetic relay 5, relay control device 10, and the like that are mounted in the vehicle 1, this need not be the case. This technique is also applicable to an electromagnetic relay, a relay control device, and the like that are mounted or installed in places other than a vehicle. Although this embodiment has described a configuration in which one electromagnetic relay 5 is provided for one load 3, and the relay control device 10 individually controls the electromagnetic relays 5, this need not be the case. For example, a configuration may be employed in which one electromagnetic relay 5 is provided for a plurality of loads 3 by grouping loads 3 having the same power supply conditions, or a configuration may be employed in which one relay control signal is used to control a plurality of electromagnetic relays 5, for example.

Although the relay control device 10 is configured to receive an IG signal as an input signal, this need not be the case. The relay control device 10 may be configured to receive input of a signal that indicates the state of an accessory switch, for example, in addition to the IG signal, and control the electromagnetic relay 5 in accordance with the input signal. For example, the relay control device 10 may be configured to communicate with other electronic devices mounted in the vehicle 1 via an in-vehicle network, and control the electromagnetic relay 5 in accordance with information obtained through the communication. The circuitry described in this embodiment (circuitry shown in FIG. 2) is an example, and does not limit the present invention.

Modification 1

Figure 4:
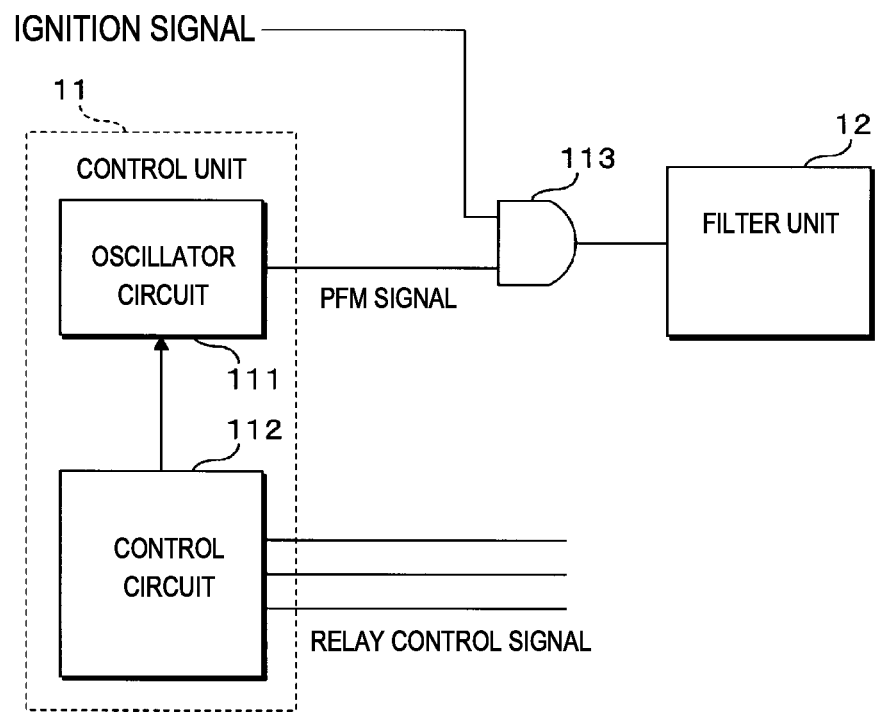
FIG. 4 is a block diagram showing a configuration of a relay control device according to a modification 1.

FIG. 4 is a block diagram showing a configuration of the relay control device 10 according to the modification 1. Note that FIG. 4 omits the circuit unit 13, voltage-drop DC/DC converter unit 14, electromagnetic relay 5, and the like. The control unit 11 in the relay control device 10 according to the modification 1 has an oscillator circuit 111 and a control circuit 112. The oscillator circuit 111 is a circuit that generates and outputs a PFM signal having a frequency, which is designated by the control circuit 112. The control circuit 112 is a circuit that controls the electromagnetic relays 5 in accordance with input of an IG signal or the like, and generates and outputs a relay control signal. The control circuit 112 outputs a signal to control operations of the oscillator circuit 111 (start and stop of the output of the PFM signal, and frequency of the PFM signal).

In the relay control device 10 according to the modification 1, an AND element 113 is provided between the control unit 11 and the filter unit 12. Specifically, the output of the oscillator circuit 111 in the control unit 11 is one input of the AND element 113, the IG signal is the other input of the AND element 113, and the output of the AND element 113 is the input of the filter unit 12. Thus, if the IG signal is in an ON state (i.e. at high level), the AND element 113 gives the PFM signal output by the oscillator circuit 111 to the filter unit 12. If the IG signal is in an OFF state (i.e. at low level), the AND element 113 cuts off the PFM signal from the oscillator circuit 111 to the filter unit 12, and gives a low-level signal to the filter unit 12.

The relay control device 10 according to the modification 1 with the above-described configuration includes the AND element 113 that cuts off the PFM signal given from the control unit 11 to the filter unit 12 if the IG switch 7 in the vehicle is in an OFF state (i.e. the IG signal is at low level). As a result, if the IG switch 7 in the vehicle 1 is in an OFF state, the PFM signal output by the control unit 11 does not pass through the filter unit 12, and the voltage-drop DC/DC converter unit 14 directly outputs the power supply voltage to the coil 52 in the electromagnetic relay 5. Accordingly, power consumption in the circuit unit 13 can be more reliably reduced when the IG switch 7 is in an OFF state. Note that, although the modification 1 has described a configuration using the AND element 113 to cut off the PFM signal, this need not be the case. A configuration may be employed where any other various methods are used to cut off the PFM signal.

Modification 2

Although the filter unit 12 in the above embodiment is a high pass filter, the filter unit 12 in the relay control device 10 according to the modification 2 is a band pass filter. The filter unit 12 according to the modification 2 cuts off the PFM signal having a frequency that does not exceed a predetermined lower limit frequency, and also cuts off the PFM signal having a frequency that exceeds a predetermined upper limit frequency, thereby allowing passage of the PFM signal having a frequency in the range from the lower limit frequency and the upper limit frequency. With a configuration in which the filter unit 12 cuts off the PFM signal having a frequency that exceeds the upper limit frequency, when, for example, the oscillator circuit 111 abnormally oscillates due to a failure, malfunction, or the like, and the control unit 11 outputs a signal having a high frequency that exceeds the upper limit frequency, the relay control device 10 according to the modification 2 can prevent the voltage-drop DC/DC converter unit 14 to operate based on this signal.

The invention claimed is:

1. A relay control device that controls switching between a conductive state and a cut-off state of an electromagnetic relay by energizing a coil, comprising:
  a voltage-drop DC/DC converter unit for dropping a voltage supplied from a power supply and outputting the dropped voltage to the coil;
  a control unit for outputting a control signal for modulating a pulse frequency to control an operation of the voltage-drop DC/DC converter unit;
  a filter unit for allowing passage of the control signal output by the control unit that has a predetermined frequency; and
  a circuit unit for controlling the operation of the voltage-drop DC/DC converter unit in accordance with a signal output by the filter unit, the circuit unit being provided between the filter unit and the voltage-drop DC/DC converter unit, wherein, if the filter unit does not allow passage of the control signal, the circuit unit performs control so that the voltage-drop DC/DC converter unit outputs the voltage supplied from the power supply without dropping the voltage, and cuts off a current path from the power supply to a ground potential within the circuit.

2. The relay control device according to claim 1, wherein the voltage-drop DC/DC converter unit is a chopper converter circuit that drops the voltage by switching between a conductive state and a cut-off state of a switching element, and if the filter unit does not allow passage of the control signal, the circuit unit keeps the switching element in a conductive state.

3. The relay control device according to claim 2, wherein the filter unit is configured to output a signal having a predetermined voltage in a case of not allowing passage of the control signal, and the circuit unit has circuitry in which no voltage change occurs within the circuit if an output signal of the filter unit does not change.

4. The relay control device according to claim 2, further comprising:

a switching element connected to the coil in series, the control unit controlling whether to set the switching unit to a conductive state or a cut-off state, wherein the control unit is configured to set the switching element to a conductive state after stopping the voltage-drop DC/DC converter unit dropping the voltage, and cause the voltage-drop DC/DC converter unit to start dropping the voltage after setting the switching element to a conductive state.

5. The relay control device according to claim 2, wherein the relay control device is mounted in a vehicle, and the relay control device further comprises a cut-off unit for cutting off the control signal from the control unit to the filter unit if an ignition switch in the vehicle is in an OFF state.

6. The relay control device according to claim 1, wherein the filter unit is configured to output a signal having a predetermined voltage in a case of not allowing passage of the control signal, and the circuit unit has circuitry in which no voltage change occurs within the circuit if an output signal of the filter unit does not change.

7. The relay control device according to claim 6, further comprising:

a switching element connected to the coil in series, the control unit controlling whether to set the switching unit to a conductive state or a cut-off state, wherein the control unit is configured to set the switching element to a conductive state after stopping the voltage-drop DC/DC converter unit dropping the voltage, and cause the voltage-drop DC/DC converter unit to start dropping the voltage after setting the switching element to a conductive state.

8. The relay control device according to claim 6, wherein the relay control device is mounted in a vehicle, and the relay control device further comprises a cut-off unit for cutting off the control signal from the control unit to the filter unit if an ignition switch in the vehicle is in an OFF state.

9. The relay control device according to claim 1, further comprising:

a switching element connected to the coil in series, the control unit controlling whether to set the switching unit to a conductive state or a cut-off state, wherein the control unit is configured to set the switching element to a conductive state after stopping the voltage-drop DC/DC converter unit dropping the voltage, and cause the voltage-drop DC/DC converter unit to start dropping the voltage after setting the switching element to a conductive state.

10. The relay control device according to claim 9, wherein the relay control device is mounted in a vehicle, and the relay control device further comprises a cut-off unit for cutting off the control signal from the control unit to the filter unit if an ignition switch in the vehicle is in an OFF state.

11. The relay control device according to claim 1, wherein the relay control device is mounted in a vehicle, and the relay control device further comprises a cut-off unit for cutting off the control signal from the control unit to the filter unit if an ignition switch in the vehicle is in an OFF state.

* * * * *